United States Patent
DiGiovanni et al.

[11] Patent Number: 5,923,684
[45] Date of Patent: Jul. 13, 1999

[54] FIBER AMPLIFIER WITH MULTIPLE PASS PUMPING

[75] Inventors: David John DiGiovanni, Montclair, N.J.; Stephen Gregory Grubb, Fremont, Calif.; Daryl Inniss, Princeton; Kenneth Lee Walker, New Providence, both of N.J.

[73] Assignee: Lucent Technologies Inc., Murray Hill, N.J.

[21] Appl. No.: 08/975,899

[22] Filed: Sep. 9, 1997

Related U.S. Application Data

[60] Provisional application No. 60/026,907, Sep. 26, 1996.

[51] Int. Cl.[6] ............................... H01S 3/30; H01S 3/00
[52] U.S. Cl. ........................... 372/6; 372/69; 372/70; 385/27; 385/42; 385/39; 359/134; 359/333; 359/341; 359/345
[58] Field of Search .................... 372/6, 69, 70, 372/71; 385/39, 42, 27; 359/333, 341, 345, 134

[56] References Cited

U.S. PATENT DOCUMENTS

| | | | |
|---|---|---|---|
| 5,140,456 | 8/1992 | Huber | 359/341 |
| 5,191,586 | 3/1993 | Huber | 372/6 |
| 5,218,608 | 6/1993 | Aoki | 372/6 |
| 5,379,148 | 1/1995 | Blondel et al. | 359/341 |
| 5,422,897 | 6/1995 | Wyatt et al. | 372/6 |
| 5,467,218 | 11/1995 | Takeda et al. | 359/341 |
| 5,499,135 | 3/1996 | Heidemann et al. | 359/341 |
| 5,532,870 | 7/1996 | Shigematsu et al. | 359/341 |
| 5,640,269 | 6/1997 | Shigematsu et al. | 359/341 |
| 5,689,595 | 11/1997 | Pan | 385/27 |
| 5,721,635 | 2/1998 | Shigematsu et al. | 359/341 |
| 5,742,427 | 4/1998 | Kakui et al. | 359/341 |

Primary Examiner—Brian Healy
Attorney, Agent, or Firm—Michael J. Urbano

[57] ABSTRACT

An optical fiber amplifier is pumped by a fiber pump laser which has a pair of separate active media within a common resonator. The fiber gain section of the amplifier is also located within the resonator.

4 Claims, 1 Drawing Sheet

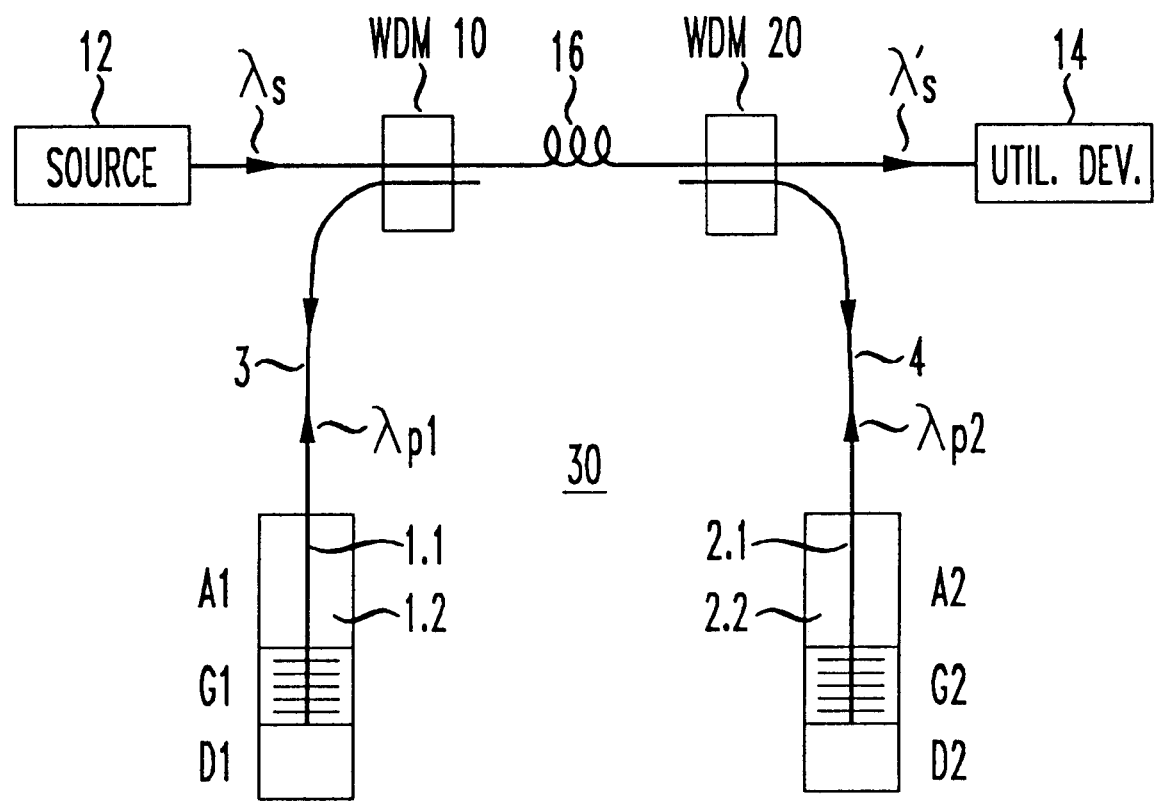

FIBER AMPLIFIER WITH MULTIPLE PASS PUMPING

BACKGROUND OF THE INVENTION

Priority of U.S. Provisional Application No. 60/026,907 filed Sep. 26, 1996, abandoned, is hereby claimed. This invention relates to optical amplifiers and, more particularly, to optical fiber amplifiers (FAMPs) in which the pump signal traverses the amplifier gain section a multiplicity of times.

In fiber optic telecommunications systems an information-bearing optical signal at one wavelength ($\lambda_s$) is amplified by propagating it through a gain section of rare earth-doped fiber simultaneously with an optical pump signal of a different wavelength ($\lambda_p$). The source of the pump signal is typically a solid state laser; e.g., a diode laser, a fiber laser, or a sapphire laser. In addition, multiple pump sources may be simultaneously coupled to the gain section. Although the use of multiple pump sources increases somewhat the complexity of the amplifier, it can serve several desirable purposes; e.g., to provide higher gain by coupling more optical power into the gain section than is possible or desirable from a single pump laser; to enable each of the pump lasers to be operated at a lower power level for a given amplifier gain, thereby extending the lifetime of the pump lasers and hence the reliability of the amplifier; and to provide redundancy in the event that one of the pump lasers were to fail.

Known schemes for coupling multiple pump lasers to a FAMP gain section include an arrangement which employs a pair of wavelength division multiplexers (WDMs)—one WDM couples a co-propagating pump signal from one pump laser to the gain section and the other couples a counter-propagating pump signal from the other laser to the gain section. See, for example, "*Optical Fiber Amplifiers: Design and System Applications,*" A. Bjarklev, Artech House, Inc., Boston-London 1993, p. 196, FIG. 8.2(*a*), which is incorporated herein by reference.

In these arrangements the gain section(s) are located external to the resonators of the pump lasers, and the pump lasers (typically diode lasers) have separate, non-overlapping resonators.

SUMMARY OF THE INVENTION

In accordance with one aspect of our invention, a FAMP is pumped by a fiber pump laser which has first and second active media within a common resonator, and the gain section of the amplifier is also located within the resonator.

BRIEF DESCRIPTION OF THE DRAWINGS

The invention, together with its various features and advantages, can be readily understood from the following more detailed description taken in conjunction with accompanying drawing, in which the sole FIGURE is a schematic of an optical fiber amplifier in accordance with one embodiment of the invention. In the interests of clarity, the FIGURE has not been drawn to scale.

DETAILED DESCRIPTION

With reference now to the FIGURE, we describe an optical communication system comprising a source 12 of an information-bearing signal $\lambda_s$ to be amplified, a utilization device 14 to which the amplified information signal $\lambda'_s$ is to be delivered, and a FAMP 30 for amplifying the information signal. The source and utilization device may be pieces of terminal equipment, sections of transmission fiber, or other FAMPs in the system, etc. In the latter case, the system would include a multi-stage FAMP configuration. The FAMP 30 illustratively includes suitable couplers, such as WDMs 10 and 20, which couple pump light $\lambda_{p1}$ and pump light $\lambda_{p2}$ to the gain section.

In accordance with one embodiment of our invention, the FAMP 30 is designed so that the pump laser comprises separate active media A1 and A2 located within a common resonator, and the gain section 16 is also located within that resonator. More specifically, the common resonator is formed by fiber grating reflectors G1 and G2 at the end points of an optical path. The path illustratively includes fiber active medium A1, single mode transmission fiber 3 coupling active medium A1 to WDM 10, the gain section 16, the WDM 20, and single mode transmission fiber 4 coupling WDM 20 to active medium A2. Other components, not shown, may be included in the resonator, and the sequence of the components shown may be altered as long as the integrity of the common resonator and the intracavity nature of the gain section 16 are both maintained.

The fiber active media A1 and A2 are themselves energized by separate sources depicted illustratively as diode lasers D1 and D2 coupled, respectively, to gratings G1 and G2. The latter are designed to be highly transmissive at the lasing wavelength $\lambda_d$ of the diode lasers, yet highly reflective at the lasing wavelengths $\lambda_{p1}$ and $\lambda_{p2}$ of the fiber pump lasers. Typically $\lambda_{p1}$ and $\lambda_{p2}$ are the same wavelength $\lambda_p$, and subscripts p1 and p2 are used as a convenience for description purposes.

In operation, the output of diode lasers at $\lambda_d$ is coupled through the gratings G1 and G2 and absorbed in the active media A1 and A2, respectively. The latter undergo stimulated emission of light at $\lambda_p$. These emissions constitute the pump signal which is coupled via transmission fibers 3 and 4 to WDMs 10 and 20, respectively. The information signal $\lambda_s$ and the pump signal $\lambda_{p1}$ are coupled to gain section 16 via WDM 10, whereas the pump signal $\lambda_{p2}$ is coupled to the gain section via WDM 20. The latter also serves to couple the amplified output signal $\lambda'_s$ to utilization device 14.

One advantage of our FAMP is that the pump signal makes multiple passes through the gain section 16 since the latter is located intracavity (i.e., within the pump laser resonator). Therefore, the pump energy conversion efficiency is expected to be higher. Also, the intensity of the pump signal along the gain section is expected to be more uniform. These features, in turn, reduce the amplifier threshold and are likely to be particularly attractive for use with Er—Yb FAMPs which tend to have higher thresholds than Er FAMPs (i.e., EDFAs). Another advantage is a simpler, more easily fabricated design brought about by the need for only two grating reflectors (as compared to four in typical prior art double-pumped FAMPs).

Although our FAMP design increases the number of intracavity components (which may introduce loss), and hence may increase the lasing threshold of the pump laser, the power available from the pump laser is expected to be more than sufficient to overcome any such additional losses without sacrificing amplifier performance or reliability.

In a preferred embodiment, the fiber pump laser is a double clad fiber laser of the type described in corresponding application Ser. No. 08/659,853 filed on Jun. 7, 1996 (DiGiovanni 26-7-11-5-53), which is incorporated herein by reference. In that case, the diode lasers D1 and D2 are coupled to gratings G1 and G2, respectively, via segments of multimode fiber (not shown). In addition, the diode lasers may be coupled to the gratings themselves via well-known lens arrangements or well-known butt coupling schemes.

It is also preferred that the fiber active media A1 and A2 be designed to enhance the coupling between the pump signal from the laser diodes and the single mode cores 1.1 and 2.1 of the active media. To this end, the "star" fiber design described by one of us, D. DiGiovanni, in copending application Ser. No. 08/561,682 filed on Nov. 22, 1995 (DiGiovanni 23) is particularly advantageous. This application is also incorporated herein by reference. Briefly, an exemplary star fiber includes a single mode silica core 1.1, 2.1 (having a nominally circular cross-section) surrounded by a lower refractive index silica cladding 1.2, 2.2 (having a star-like cross-section), respectively. The latter is, in turn, surrounded by a yet lower index polymer cladding, not shown (having a nominally circular cross-section). The star-like cross-section of the claddings 1.2, 2.2 serve to reflect the pump light $\lambda_d$ so that it intersects the single-mode cores 1.1, 2.1 a plurality of times, thereby causing them to lase at the pump wavelength $\lambda_p$.

The fiber gratings are advantageously Bragg gratings which are UV-written into a single mode fiber using, illustratively, the technique described in *Optics Letters*, Vol. 14, No. 15 (Aug. 1, 1989), pp. 823–825, which is incorporated herein by reference. As shown in the FIGURE, the gratings appear to extend outside the single mode cores 1.1 and 2.1; that depiction is for clarity only; in practice, the gratings are confined to the single mode cores. Also, the gratings may be separate fiber sections fused to the active media or may be formed on the same fiber as the active media.

The WDMs 10 and 20 and other devices for routing signals are described, for example, in Bjarklev, supra, pp. 160–161.

Each of the laser diodes D1 and D2 may be single laser, an array of lasers, a single laser with multiple active stripes, or any other design suitable for coupling sufficient power at $\lambda_d$ into the active media A1 and A2, respectively. The composition of the laser diode, in particular its active region, is determined by the desired wavelength $\lambda_d$; for example, AlGaAs laser diodes are suitable for operation at $\lambda_d$ wavelengths in the range of about 800–870 nm, whereas InGaAs laser diodes (e.g., of the strained quantum well variety) are suitable for wavelengths in the range of about 870–1000 nm.

Although not explicitly shown in the schematic FIGURE, the joining of the various sections of fibers, including the fiber gratings to the active media and the latter to the transmission fibers, may be accomplished by well-known, low loss fusion splices of the type described in U.S. Pat. No. 5,074,633 granted to L. G. Cohen et al. on Dec. 24, 1991 and incorporated herein by reference.

Illustratively, the gain section 16 comprises a single mode silica Er—Yb doped fiber for amplifying an information signal at a wavelength $\lambda_s \approx 1550$ nm; the transmission fibers are single mode silica fibers; the active media A1 and A2 are Nd-doped single mode "star" fibers which emit the pump signal at $\lambda_p \approx 1060$ nm when excited by GaAs—AlGaAs laser diodes D1 and D2, respectively, which generate radiation at about 800 nm. The gratings G1 and G2 have high reflectivity at the pump wavelength (1060 nm) and low reflectivity at the diode laser wavelength (800 nm).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

The invention claimed is:

1. An optical fiber amplifier comprising:

a section of fiber which exhibits gain when excited by an optical pump signal, fiber pump laser means for generating a pump signal which propagates bidirectionally through said gain section, and coupler means for coupling said pump signal to said gain section,

CHARACTERIZED IN THAT:

said pump means comprises first and second fiber laser active media having a common resonator, and said gain section is located within said resonator.

2. The amplifier of claim 1 further characterized in that said pump means comprises first and second high reflectivity grating reflectors located on opposite sides of said coupling means and forming said resonator between them, and said first and second active media are located adjacent said first and second reflectors and within said resonator.

3. The amplifier of claim 1 wherein said active media comprise rare-earth doped optical fibers.

4. The amplifier of claim 1 wherein said pump means comprises a double clad fiber laser.

* * * * *